(12) United States Patent
Zeng

(10) Patent No.: US 10,325,976 B2
(45) Date of Patent: Jun. 18, 2019

(54) DISPLAY PANEL AND DISPLAY DEVICE THEREOF

(71) Applicant: Wuhan China Star Optoelectronics Semiconductor Display Technology Co., Ltd., Wuhan, Hubei (CN)

(72) Inventor: Mian Zeng, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/736,709

(22) PCT Filed: Nov. 28, 2017

(86) PCT No.: PCT/CN2017/113432
§ 371 (c)(1),
(2) Date: Dec. 14, 2017

(65) Prior Publication Data
US 2019/0157377 A1 May 23, 2019

(30) Foreign Application Priority Data
Nov. 21, 2017 (CN) .......................... 2017 1 1168008

(51) Int. Cl.
*H01L 27/32* (2006.01)
*H01L 51/52* (2006.01)
(52) U.S. Cl.
CPC ...... *H01L 27/3297* (2013.01); *H01L 27/3244* (2013.01); *H01L 51/5206* (2013.01); *H01L 51/5221* (2013.01); *G09G 2320/0233* (2013.01)

(58) Field of Classification Search
CPC ........ G09G 2320/0233; H01L 27/3244; H01L 27/3297; H01L 51/5206; H01L 51/5221
See application file for complete search history.

(56) References Cited

U.S. PATENT DOCUMENTS

2009/0046040 A1* 2/2009 Iida ...................... G09G 3/3233
345/76
2009/0046041 A1* 2/2009 Tanikame ............ G09G 3/3233
345/76

(Continued)

FOREIGN PATENT DOCUMENTS

CN 101763824 6/2010
CN 101859541 10/2010

(Continued)

*Primary Examiner* — Allan R Wilson
(74) *Attorney, Agent, or Firm* — Hauptman Ham, LLP

(57) ABSTRACT

The present invention discloses a display panel. The display panel, comprises a substrate. The substrate includes a plurality of display areas and a plurality of non-display areas surrounded by the display areas, wherein each of the display areas is divided into at least two sub display areas along a predetermined direction; a boundary between the sub-display areas is a straight line or a polyline; and a plurality of organic light emitting diodes is disposed in the sub-display areas; and a plurality of powerlines, disposed on the periphery of each of the sub-display areas, wherein the powerlines are located in the non-display areas; the powerlines on the periphery of display areas are independent from each other and a power voltage is applied on the organic light emitting diodes of each of the sub-display areas via the powerlines so that each of the organic light emitting diodes receives the same power voltage.

4 Claims, 4 Drawing Sheets

(56) References Cited

U.S. PATENT DOCUMENTS

| | | | |
|---|---|---|---|
| 2010/0177086 A1 | 7/2010 | Nakamura et al. | |
| 2011/0234925 A1* | 9/2011 | Tatara | G09G 3/3233 348/800 |
| 2018/0166017 A1* | 6/2018 | Li | H01L 27/32 |
| 2018/0240856 A1* | 8/2018 | Kim | H01L 27/3276 |

FOREIGN PATENT DOCUMENTS

| | | |
|---|---|---|
| CN | 103927968 | 7/2014 |
| CN | 104050915 | 9/2014 |
| CN | 107887421 | 4/2018 |

* cited by examiner

DISPLAY PANEL AND DISPLAY DEVICE THEREOF

RELATED APPLICATIONS

The present application is a National Phase of International Application Number PCT/CN2017/113432, filed Nov. 28, 2017, and claims the priority of China Application No. 201711168008.9, filed Nov. 21, 2017.

FIELD OF THE DISCLOSURE

This invention is related to the display technology, especially related to the display panel of the display device.

BACKGROUND

Recently, the organic light emitting diode (OLED) display become a very popular flat display product worldwide due to OLED display panel's self-luminosity, wide view angle, short responsive time, high light emitting efficacy, wide color gamut, compact size, large-side display compatibility, flexibility, simple manufacturing process and the potential of low cost.

In OLED display panel, the AMOLED display panel is one of major technologies of flexible display. However, the luminous uniformity and the after-image are two major issues to be overcome in AMOLED technology, IR drop is one of the factors causing these two major issues. Due to the resist of the powerline (metal made), the current pass through the powerline with a certain voltage drop, which is so call "IR drop". IR drop would cause the voltage applied at the point near the power differs the voltage applied at the point away from the power. The current of the OLED device is related to the voltage applied on the powerline. Therefore, the IR drop would cause the different areas connected to the powerline have different currents so that the luminosity is not uniform and the display quality is affected. The IP drop is one of the major issues to be solved while designing the display panel.

FIG. 1 is the powerline layout of the conventional AMOLED. In FIG. 1, the two terminals of the chip 1 are connected with an anode 2 with a positive voltage Vdd and a cathode 3 with a negative voltage Vss. The positive powerline 21 is connected with the anode 2 and extending to the display areas in the display panel. A plurality of the positive powerlines 21 are arranged in parallel, and negative powerline 31 is connected with a cathode 3 and extending to the non-display area. As mentioned above, the voltage applied on the positive powerline 21 and the negative powerline 31 are different so that the currency in different areas of the OLED device is different as well. The luminosity of the display panel is not uniform so that the display quality is affected.

SUMMARY

In view of the deficiencies of the prior art, the present invention provides a panel polishing apparatus and a polishing method, which can greatly improve the polishing efficiency.

In order to achieve the above purpose, the present invention adopts the following technical solutions:

The present invention provides a display panel. The display panel comprises a substrate, comprising a plurality of display areas and a a plurality of non-display areas surrounded by the display areas, wherein each of the display areas is divided into to at least two sub-display areas along a predetermined direction; a boundary between the sub-display areas is a straight line or a polyline; and a plurality of organic light emitting diodes is disposed in the sub-display areas; and a plurality of powerlines, disposed on the periphery of each of the sub-display areas, wherein the powerlines are located in the non-display areas; the powerlines on the periphery of display areas are independent from each other and a power voltage is applied on the organic light emitting diodes of each of the sub-display areas via the powerlines so that each of the organic light emitting diodes receives the same power voltage.

Preferably, the polyline is selected from one of the following group of the rectangular zigzag line, the trapezoid zigzag line and the triangular zigzag line.

Preferably, the display area is divided into three sub-display areas, wherein the sub-display areas comprises a first sub-display area, a second display area, and a third display area; the boundary between the first sub-display area and the second sub-display area is a straight line or a polyline; the boundary between the second sub-display area and the third sub-display area is a straight line or a polyline; the boundary of the first sub-display area and the third sub-display area is a straight line or a polyline; and the plurality of organic light emitting diodes are located on the first sub-display area, the second sub-display area, and the third sub-display area.

Preferably, the display panel further comprises a chip disposed on the non-display area of the first sub-display area, wherein a plurality of first powerlines are disposed on the non-display areas next the right side and the left side of the first sub-display area respectively, and the first powerline is connected with a first power source of the chip, used for receiving a first power voltage applied to all of the organic light emitting diodes in the first sub-display area.

Preferably, a plurality of second powerlines are disposed on the non-display areas next the right side and the left side of the first sub-display area respectively; the first powerlines and the second powerlines are independent from each other and the second powerline is connected with a second power source of the chip, used for receiving a second power voltage applied to all of the organic light emitting diodes in the first sub-display area.

Preferably, a plurality of second powerlines are disposed on the non-display areas next the right side and the left side of the third sub-display area respectively; the third powerlines and the second powerlines are independent from each other and the third powerline is connected with a third power source of the chip, used for receiving a third power voltage applied to all of the organic light emitting diodes in the first sub-display area.

Preferably, the first power voltage, the second power voltage and the third power voltage are negative voltage.

Preferably, the first powerline is connected to an anode of all the organic light emitting diode in the first sub-display area, the second powerline is connected to an anode of all the organic light emitting diode in the second sub-display area, and the third powerline is connected to an anode of all the organic light emittind diode in the third sub-display area.

The present invention also provides a display device including the display panel mentioned above.

The present invention provides different power voltages on different area by dividing the display area. All organic light emitting dude can receive the same power voltage in the display panel so that the IR drop can be eliminated and the display quality is enhanced.

DETAILED DESCRIPTION OF PREFERRED EMBODIMENTS

In order to make the purpose, technical solutions and advantages of the present invention more comprehensible, the present invention is further described in detail below with reference to the accompanying drawings and embodiments. It should be understood that the specific embodiments described herein are only used to explain the present invention, and are not intended to limit the present invention.

The present invention provides a display panel. The display panel comprises a substrate, comprising a plurality of display areas and a a plurality of non-display areas surrounded by the display areas, wherein each of the display areas is divided into to at least two sub-display areas along a predetermined direction; a boundary between the sub-display areas is a straight line or a polyline; and a plurality of organic light emitting diodes is disposed in the sub-display areas; and a plurality of powerlines, disposed on the periphery of each of the sub-display areas, wherein the powerlines are located in the non-display areas; the powerlines on the periphery of display areas are independent from each other and a power voltage is applied on the organic light emitting diodes of each of the sub-display areas via the powerlines so that each of the organic light emitting diodes receives the same power voltage.

Moreover, the polyline is selected from one of the following group of the rectangular zigzag line, the trapezoid zigzag line and the triangular zigzag line.

Figure 1:
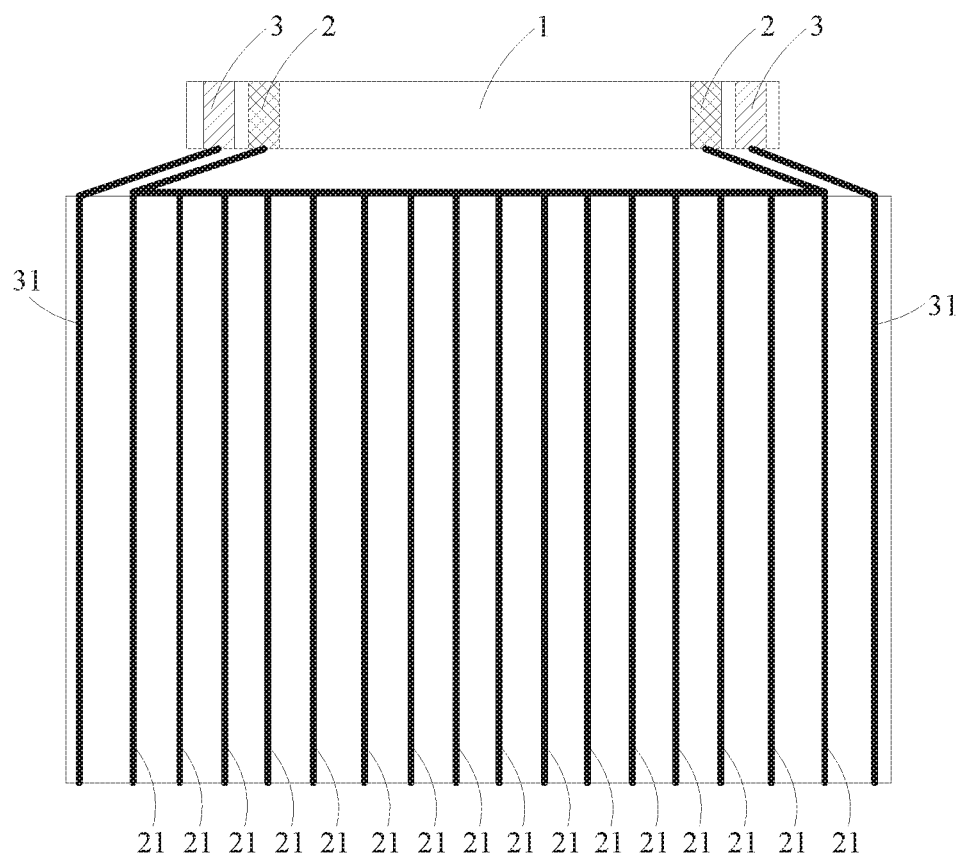
FIG. 1 is a powerline layout of the conventional AMOLED display panel.
Figure 2:
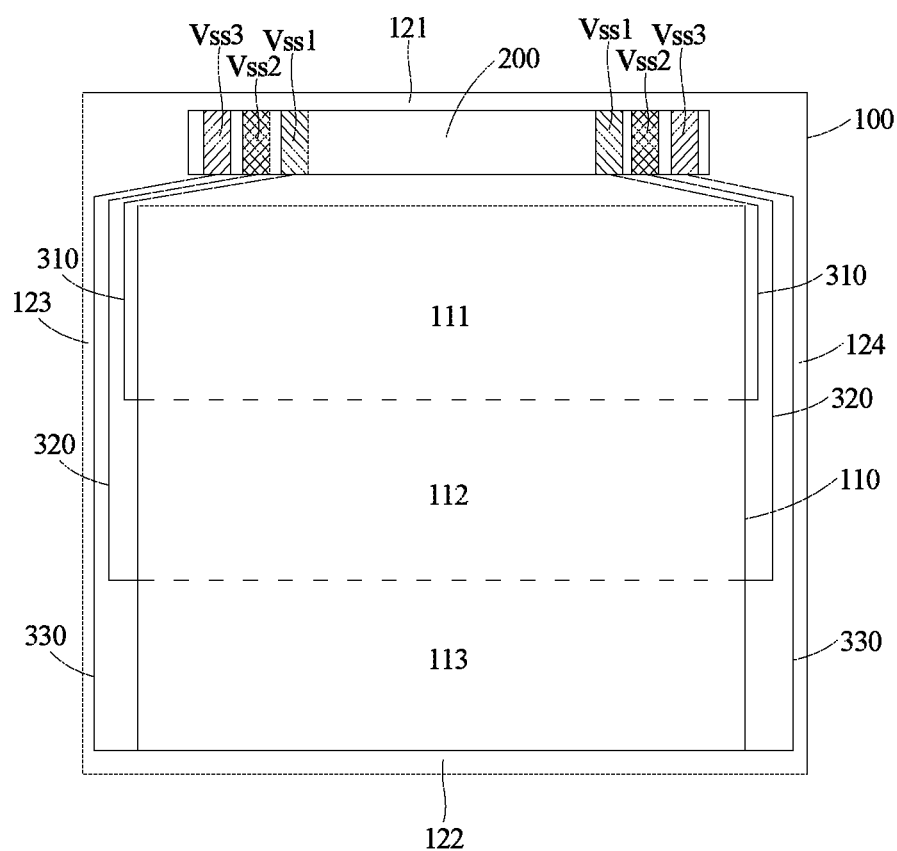
FIG. 2 is a powerline layout of an embodiment of the present invention.

FIG. 2 illustrates the powerline layout of the display panel of the embodiment. In the present embodiment, the display panel is an AMOLED panel, but not limited thereto.

With reference to FIG. 2, the present embodiment includes a substrate 100, a chip 200, a first powerline 310, a second powerline 320 and a third powerline 330.

To be specific, the substrate 100 includes a display area 110 and a non-display area surrounded by the display area 110. The display area 110 is dividing into three sub-display areas, which are a first sub-display area 111, a second sub-display area 112, and a third sub-display area 113, accordingly along a predetermined direction from the upper side to the lower side. To be clear, when the substrate 100 is rotated in 90 degree, the upper and lower sides become right side and left side. When the substrate 100 is rotated 180 degree, the upper side become the lower side.

A boundary (shown as a dash line in FIG. 2) between the first sub-display area 111 and the second sub-display area 112 is a straight line, and a boundary (shown as a dash line in FIG. 2) between the second sub-display area 111 and the third sub-display area 112 is also a straight line. However, this invention is not limited to this.

For example, the boundary between the first sub-display area 111 and the second sub-display area 112 is a polyline, and a boundary between the second sub-display area 111 and the third sub-display area 112 is also a polyline.

Figure 3:
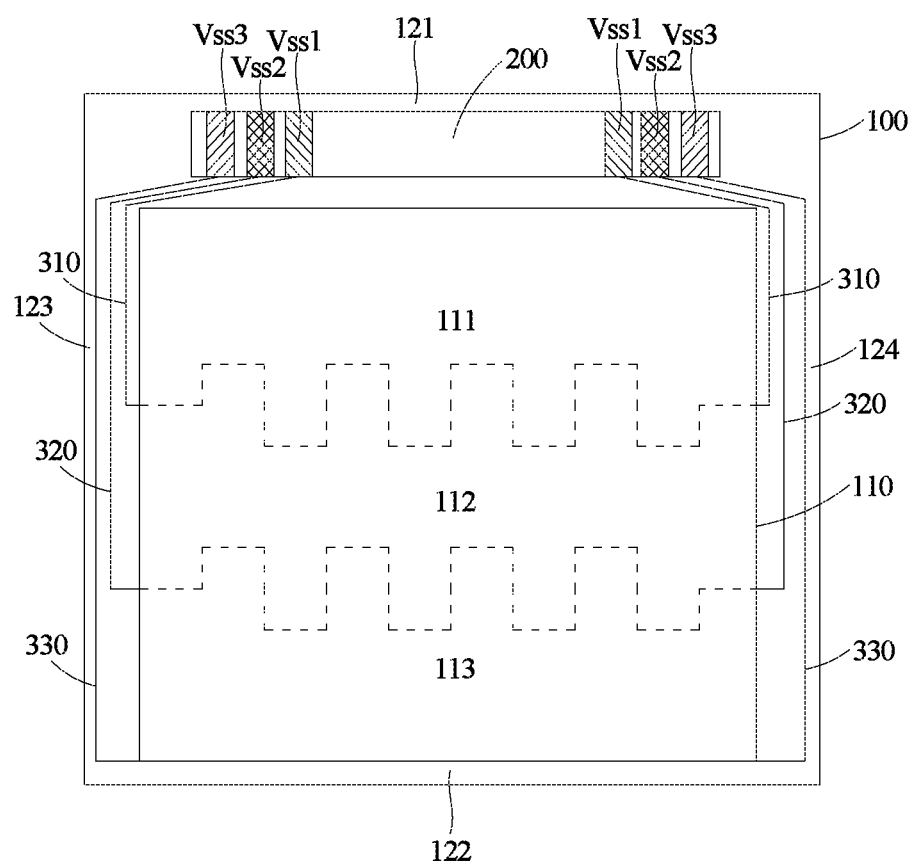
FIG. 3 is a powerline layout of another embodiment of the present invention.

With reference to FIG. 3, this invention provides another embodiment. The boundary (shown as a dash line in FIG. 3) between the first sub-display area 111 and the second sub-display area 112 is a rectangular zigzag line, and a boundary (shown as a dash line in FIG. 3) between the second sub-display area 111 and the third sub-display area 112 is also a rectangular zigzag line.

Figure 4:
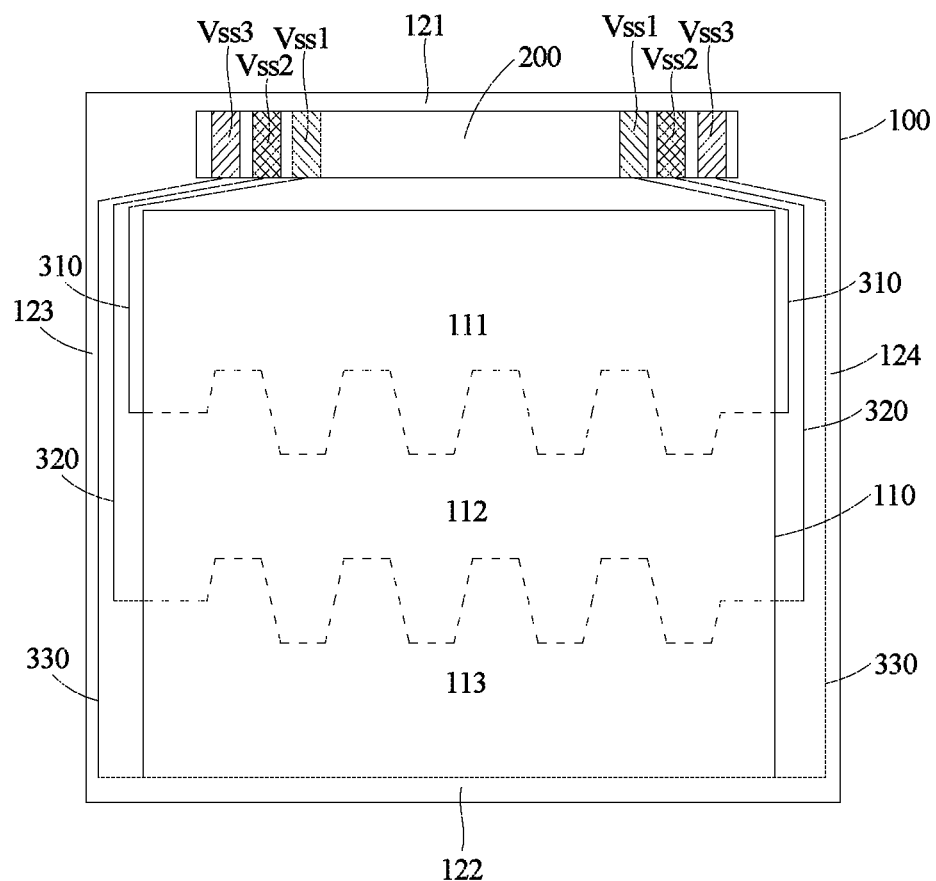
FIG. 4 is a powerline layout of the other embodiment of the present invention.

FIG. 4 is the other embodiment of this invention. The boundary (shown as a dash line in FIG. 4) between the first sub-display area 111 and the second sub-display area 112 is a trapezoid zigzag line, and a boundary (shown as a dash line in FIG. 3) between the second sub-display area 111 and the third sub-display area 112 is also a trapezoid zigzag line.

In some other embodiment, the boundary shown in FIGS. 3-4 could be a triangular zigzag line or the others.

As one of the embodiments of the present invention, the boundary between the first sub-display area 111 and the second sub-display area 112 is a straight line, the boundary between the second sub-display area 112 and the third sub-display area 113 is a polyline; or the boundary between the first sub-display area 111 and the second sub-display area 112 is a rectangular zigzag line, the boundary between the second sub-display area 112 and the third sub-display area 113 is a trapezoid zigzag line.

In the present invitation, the polyline boundary design is for avoiding the mura in the boundary area between two sub-display areas.

There is a plurality of OLED disposed in the first sub-display area 111, the second sub-display area 112, and the third sub-display area 113. In AMOLED display panel, the OLED and the control unit (such as TFTs and capacitors) are composed as a display pixel.

Besides, the non-display area surrounding the display area 110 includes an upper non-display area 121 disposed next to the upper side of the display area, a lower non-display area 122 disposed next to the lower side of the display area 110, a left non-display area 123 disposed next to the left side of the display area 110, and a right non-display area 124 disposed next to the right side of the display area 110.

The chip 200 is disposed on the upper non-display area 121, and the terminals of the chop 200 includes a first power terminal Vss1, a second power terminal Vss2, and a third power terminal Vss3. A first power voltage is provided by the first power terminal Vss1, a second power voltage is provided by the second power terminal Vss2, and a third power voltage is provided by the third power terminal Vss3. In the present embodiment, the first power voltage, the second power voltage and the third power voltage is negative. However, in some other embodiments, the power voltage can be positive.

The first powerlines 310 are disposed on the left side non-display area 123 and the right side non-display area 123 respectively of the first sub-display area 111. The first powerlines are connected with the first power terminal Vss1, used for receiving the first power voltage applied to a cathode of the OLED. Besides, the first powerline 310 is connected to and provides a first power voltage to the cathode of the OLED in the first sub-display area 111.

The second powerlines 320 are disposed on the left side non-display area 123 and the right side non-display area 123 respectively of the second sub-display area 112. The second powerlines 320 extends on the non-display areas of the first sub-display area (left side powerline extends on the left side non-display area, and vice versa) to connected to the second power terminal Vss2 of the chip 200. The second powerlines 320 are connected with the second power terminal Vss2, used for receiving the second power voltage applied to a cathode of the OLED. The first powerlines 310 and the second powerlines 320 are independent from each other. Besides, the second powerline 320 is connected to and provides a second power voltage to the cathode of the OLED in the second sub-display area 112.

The third powerlines 330 are disposed on the left side non-display area 123 and the right side non-display area 123 respectively of the third sub-display area 113. The third powerlines 330 extends on the non-display areas of the first sub-display area and the second sub-display area (left side powerline extends on the left side non-display area, and vice versa) to connected to the third power terminal Vss3 of the chip 200. The third powerlines 330 are connected with the third power terminal Vss3, used for receiving the third power voltage applied to a cathode of the OLED. The first powerlines 310, the second powerlines 320 and the third powerlines 330 are independent from each other. Besides, the third powerline 320 is connected to and provides a third power voltage to the cathode of the OLED in the third sub-display area 113.

As described in the background, due to the resist of the powerline, the OLED might receive different voltage from the powerline when the power voltage is delivered via the power line. Besides, the length of the powerline varies the the resist as well so that the power voltage applied on the OLED on different areas of the display panel varies as well. In the present invention, the power voltage is provided by the areas. According to the simulation or actual experiments, the IR drop can be eliminated and each of the OLEDs on the panel can receive the same power voltage.

The details of the present invention would be described in the following embodiments. In the following embodiment, the display area is divided into three sub-display area. However, it's just a exemplary description without further limitation to this invention. The number of the sub-display areas could be determined according to the actual requirement.

The above descriptions are merely specific implementation manners of the present application. It should be noted that those skilled in the art may make some improvements and modifications without departing from the principle of the present application. These improvements and modifications should be regarded as the scope of protection of this application.

What is claimed is:

1. A display panel, comprising
a substrate, comprising a plurality of display areas and a plurality of non-display areas surrounding the display areas, wherein each of the display areas is divided into at least two sub-display areas along a predetermined direction; a boundary between the sub-display areas is a straight line or a polyline; and a plurality of organic light emitting diodes is disposed in the sub-display areas;
a plurality of powerlines, disposed on the periphery of each of the sub-display areas, wherein the powerlines are located in the non-display areas; the powerlines on the periphery of display areas are independent from each other and a power voltage is applied on the organic light emitting diodes of each of the sub-display areas via the powerlines so that each of the organic light emitting diodes receives the same power voltage;
wherein the display area is divided into three sub-display areas comprising a first sub-display area, a second display area, and a third display area; the boundary between the first sub-display area and the second sub-display area is a straight line or a polyline; the boundary between the second sub-display area and the third sub-display area is a straight line or a polyline; the boundary of the first sub-display area and the third sub-display area is a straight line or a polyline; and the plurality of organic light emitting diodes are located on the first sub-display area, the second sub-display area, and the third sub-display area;
wherein a chip is disposed on the non-display area of the first sub-display area, a plurality of first powerlines are disposed on the non-display areas next to the right side and the left side of the first sub-display area respectively, and the first powerlines are connected with a first power source of the chip, used for receiving the first power voltage applied to all of the organic light emitting diodes in the first sub-display area;
wherein a plurality of second powerlines are disposed on the non-display areas next to the right side and the left side of the first sub-display area respectively; the second powerlines are connected with a second power source of the chip, used for receiving the second power voltage applied to all of the organic light emitting diodes in the second sub-display area; and
wherein a plurality of third powerlines are disposed on the non-display areas next to the right side and the left side of a third sub-display area respectively; the first powerlines, the second powerlines and the third powerlines are independent from each other and the third powerlines are connected with a third power source of a chip, used for receiving a second power voltage applied to all of the organic light emitting diodes in the third sub-display area, the first powerlines are connected to an anode of all the organic light emitting diode in the first sub-display area, the second powerlines are connected to an anode of all the organic light emitting diode in the second sub-display area, and the third powerlines are connected to an anode of all the organic light emitting diode in the third sub-display area.

2. The display panel according to claim 1, wherein the polyline is selected from one of the following group of the rectangular zigzag line, the trapezoid zigzag line and the triangular zigzag line.

3. The display panel according to claim 1, wherein the first power voltage, the second power voltage and the third power voltage are negative voltage.

4. A display device, comprising a display panel according to claim 1.

* * * * *